(12) United States Patent
Um et al.

(10) Patent No.: US 11,029,363 B2
(45) Date of Patent: Jun. 8, 2021

(54) METHOD AND DEVICE FOR PREDICTING BATTERY LIFE

(71) Applicant: OCI Company Ltd., Seoul (KR)

(72) Inventors: MyungSup Um, Seongnam-si (KR); HeeChang Ye, Seongnam-si (KR)

(73) Assignee: OCI COMPANY LTD., Seoul (KR)

( * ) Notice: Subject to any disclaimer, the term of this patent is extended or adjusted under 35 U.S.C. 154(b) by 245 days.

(21) Appl. No.: 16/156,409

(22) Filed: Oct. 10, 2018

(65) Prior Publication Data
US 2019/0113578 A1 Apr. 18, 2019

(30) Foreign Application Priority Data
Oct. 12, 2017 (KR) .......................... 10-2017-0132858

(51) Int. Cl.
*G01N 27/416* (2006.01)
*G01R 31/392* (2019.01)
(Continued)

(52) U.S. Cl.
CPC .......... *G01R 31/392* (2019.01); *G01R 31/367* (2019.01); *G01R 31/3648* (2013.01); *G01R 31/374* (2019.01); *G01R 31/382* (2019.01); *G01R 31/3835* (2019.01); *G01R 31/3842* (2019.01); *G01R 31/396* (2019.01); *G01R 31/385* (2019.01)

(58) Field of Classification Search
CPC .......................... G01R 31/382; G01R 31/3835; G01R 31/392; G01R 31/3842; G01R 31/396; G01R 31/367; G01R 31/3648; G01R 31/385

USPC ............................ 324/76.11–76.83, 425, 426
See application file for complete search history.

(56) References Cited

U.S. PATENT DOCUMENTS 9,395,419 B2 7/2016 Park et al.
9,714,984 B2 7/2017 Kim
(Continued)

FOREIGN PATENT DOCUMENTS

KR 10-1429292 B1 8/2014
KR 10-1498761 B1 3/2015
(Continued)

OTHER PUBLICATIONS

M. Berecibar et al. "Critical Review of State of Health Estimation Methods of Li-ion Batteries for Real Applications". Renewable and Sustainable Energy Reviews vol. 56. Elsevier. 2016. pp. 572-587.

*Primary Examiner* — Raul J Rios Russo
(74) *Attorney, Agent, or Firm* — Harness, Dickey & Pierce, P.L.C.

(57) ABSTRACT

Provided is a device including an acquisition unit configured to obtain a time taken for a voltage level of a battery in a charge mode to change for each of a plurality of voltage sections, and a prediction unit configured to predict a state of health (SOH) of the battery based on ratio information determined by comparing the time obtained for each of the plurality of voltage sections with a reference time for each of the plurality of voltage sections. When the time taken for some voltage sections of the plurality of voltage sections is obtained by the acquisition unit, the prediction unit corrects the predicted SOH of the battery based on the time taken for the voltage level of the battery in a discharge mode to change.

14 Claims, 6 Drawing Sheets

(51) Int. Cl.
   *G01R 31/36* (2020.01)
   *G01R 31/374* (2019.01)
   *G01R 31/382* (2019.01)
   *G01R 31/3835* (2019.01)
   *G01R 31/3842* (2019.01)
   *G01R 31/396* (2019.01)
   *G01R 31/367* (2019.01)
   *G01R 31/385* (2019.01)

(56) References Cited

U.S. PATENT DOCUMENTS

| | | | |
|---|---|---|---|
| 2015/0349547 A1* | 12/2015 | Jeon | G01R 31/3648 320/134 |
| 2016/0003917 A1 | 1/2016 | You et al. | |
| 2016/0202323 A1 | 7/2016 | Lee et al. | |
| 2018/0024199 A1 | 1/2018 | Lee et al. | |
| 2018/0031642 A1* | 2/2018 | Sung | G01R 31/392 |
| 2018/0123185 A1* | 5/2018 | Kim | G01R 31/392 |
| 2018/0149708 A1* | 5/2018 | Shoa | G01R 31/367 |
| 2019/0248252 A1* | 8/2019 | Jin | B60L 58/12 |
| 2019/0317150 A1* | 10/2019 | Park | G01R 31/382 |

FOREIGN PATENT DOCUMENTS

| | | |
|---|---|---|
| KR | 10-2015-0054162 A | 5/2015 |
| KR | 10-1547004 B1 | 8/2015 |
| KR | 10-2015-0109643 A | 10/2015 |
| KR | 10-2016-0004077 A | 1/2016 |
| KR | 10-2016-0007870 A | 1/2016 |
| KR | 10-1631154 B1 | 6/2016 |
| KR | 10-2016-0079637 A | 7/2016 |
| KR | 10-2016-0085529 A | 7/2016 |
| KR | 10-1655583 B1 | 9/2016 |
| KR | 10-1772036 B1 | 8/2017 |
| KR | 10-1817396 B1 | 1/2018 |
| KR | 10-1847685 B1 | 4/2018 |

* cited by examiner

FIG. 2

| Cycle | 3.50~3.60V | 3.60~3.70V | 3.70~3.80V | 3.80~3.90V | 3.90~4.00V | 4.00~4.10V |
|---|---|---|---|---|---|---|
| 50 | 840 | 1120 | 960 | 710 | 830 | 590 |
| 51 | 840 | 1130 | 960 | 400 | | |
| 52 | 670 | 1020 | 950 | 710 | 820 | 600 |
| 53 | | 210 | 810 | 570 | 800 | 160 |
| 54 | 260 | 920 | 930 | 680 | 810 | 600 |
| 55 | 840 | 1120 | 960 | 400 | | |
| 56 | 670 | 1030 | 940 | 700 | 830 | 600 |
| 57 | | 220 | 810 | 560 | 810 | 150 |
| 58 | 270 | 910 | 930 | 680 | 810 | 600 |
| 59 | 840 | 1120 | 960 | 400 | | |
| 60 | 680 | 1020 | 940 | 700 | 830 | 600 |
| 61 | | 220 | 800 | 560 | 810 | 150 |
| 62 | 260 | 920 | 920 | 680 | 810 | 590 |
| 63 | 840 | 1120 | 950 | 400 | | |
| 64 | 670 | 1010 | 940 | 710 | 820 | 600 |

| | 3.70~3.60V | |
|---|---|---|
| | 390 | 102.6 |
| | 380 | [100.0] |
| | 380 | 100.0 |
| | 380 | 100.0 |
| | 370 | 97.4 |
| | 370 | 97.4 |
| | 370 | 97.4 |
| | 370 | 97.4 |

FIG. 3

| Cycle | 3.50~3.70V | 3.50~3.70V % | 3.60~3.80V | 3.60~3.80V % | 3.70~3.90V | 3.70~3.90V % | 3.80~4.00V | 3.80~4.00V % | 3.90~4.10V | 3.90~4.10V % |
|---|---|---|---|---|---|---|---|---|---|---|
| 50 | 1960 | 98.5 | 2080 | 97.7 | 1670 | 99.4 | 1540 | 99.4 | 1420 | 99.3 |
| 51 | 1970 | 99.0 | 2090 | 98.1 | 1360 | | 400 | | 0 | |
| 52 | 1690 | ↔ | 1970 | TRUE | 1660 | 98.8 | 1530 | 98.7 | 1420 | 99.3 |
| 53 | 210 | | 1020 | FALSE | 1380 | 98.8 | 1370 | | 960 | FALSE |
| 54 | 1180 | | 1850 | FALSE | 1610 | 95.8 | 1490 | 96.1 | 1410 | 98.6 |
| 55 | 1960 | 98.5 | 2080 | TRUE | 1360 | | 400 | | 0 | FALSE |
| 56 | 1700 | ↔ | 1970 | FALSE | 1640 | 97.6 | 1530 | 98.7 | 1430 | 100.0 |
| 57 | 220 | | 1030 | FALSE | 1370 | | 1370 | FALSE | 960 | FALSE |
| 58 | 1180 | | 1840 | FALSE | 1610 | 95.8 | 1490 | 96.1 | 1410 | 98.6 |
| 59 | 1960 | 98.5 | 2080 | TRUE | 1360 | | 400 | FALSE | 0 | FALSE |
| 60 | 1700 | ↔ | 1960 | FALSE | 1640 | 97.6 | 1530 | 98.7 | 1430 | 100.0 |
| 61 | 220 | | 1020 | FALSE | 1370 | | 1370 | FALSE | 960 | FALSE |
| 62 | 1180 | | 1840 | FALSE | 1600 | 95.2 | 1490 | 96.1 | 1400 | 97.9 |
| 63 | 1960 | 98.5 | 2070 | TRUE | 1350 | | 400 | FALSE | 0 | FALSE |
| 64 | 1680 | FALSE | 1950 | FALSE | 1650 | 98.2 | 1530 | 98.7 | 1420 | 99.3 |

400

METHOD AND DEVICE FOR PREDICTING BATTERY LIFE

CROSS-REFERENCE TO RELATED APPLICATIONS

This U.S. non-provisional patent application claims priority under 35 U.S.C. § 119 of Korean Patent Application No. 10-2017-0132858, filed on Oct. 12, 2017, the entire contents of which are hereby incorporated by reference.

BACKGROUND

The present disclosure herein relates to a battery life predicting method and device, and more particularly, to a method and device for predicting battery life based on a voltage change of a battery.

Research to increase user's convenience while checking a battery state more accurately has been continued. Especially, for proper capacity design, operation, maintenance/repair, and economical efficiency of a battery applied to Electric Vehicle (EV) and Energy Storage System (ESS), it may be necessary to predict the life of the battery.

Battery life prediction is easy for full charge/discharge, but since life prediction is not easy because EV or ESS battery operation is often partial charge/discharge, real-time battery life prediction needs to be performed in real-world applications.

SUMMARY

The present disclosure is to provide a device and method for efficiently predicting the life of a battery based on time information that varies depending on a charging/discharging voltage section.

An embodiment of the inventive concept provides a device including: an acquisition unit configured to obtain a time taken for a voltage level of a battery in a charge mode to change for each of a plurality of voltage sections; and a prediction unit configured to predict a state of health (SOH) of the battery based on ratio information determined by comparing the time obtained for each of the plurality of voltage sections with a reference time for each of the plurality of voltage sections, wherein when the time taken for some voltage sections of the plurality of voltage sections is obtained by the acquisition unit, the prediction unit corrects the predicted SOH of the battery based on the time taken for the voltage level of the battery in a discharge mode to change.

In an embodiment of the inventive concept, a method includes: obtaining a time taken for a voltage level of a battery in a charge mode to change for each of a plurality of voltage sections; predicting a state of health (SOH) of the battery based on ratio information determined by comparing the time obtained for each of the plurality of voltage sections with a reference time for each of the plurality of voltage sections; and when the time taken for some voltage sections of the plurality of voltage sections is obtained, correcting the predicted SOH of the battery based on the time taken for the voltage level of the battery in a discharge mode to change.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 2 is a table showing the results of measuring the time taken for a voltage change for each voltage section in any of a plurality of cycles, according to an embodiment;

FIG. 3 is a table showing the time taken for a voltage change with respect to a voltage section in which consecutive voltage sections are added, according to an embodiment;

DETAILED DESCRIPTION

Figure 1:
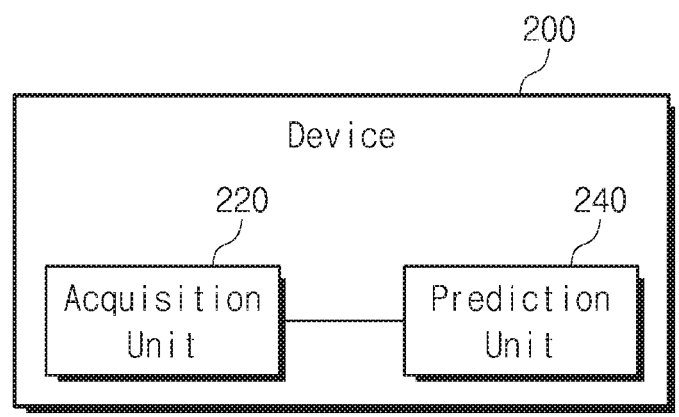
FIG. 1 is a block diagram of a device according to an embodiment.

Below, in order for the inventive concept to be easily implemented by those skilled in the art, some embodiments will be described in detail and with reference to the accompanying drawings.

Hereinafter, the term "part" or "module" used in the specification may mean a hardware component or an electronic circuit such as FPGA or ASIC.

The battery system according to an embodiment may include a battery and a battery controller. The battery may supply power to driving means (e.g., an electric vehicle) equipped with the battery system, and may include a plurality of battery modules. Each of the plurality of battery modules may include a plurality of cells. The plurality of battery modules may be mixedly connected in series and in parallel. According to an embodiment, the plurality of battery modules may be a secondary battery such as a lithium ion battery. In addition, the capacities of the plurality of battery modules may be the same or different from each other. According to an embodiment, the battery system may refer to an Energy Storage System (ESS).

The battery controller may monitor the condition of the battery and control the battery. The battery controller according to an exemplary embodiment may perform thermal control of a plurality of battery modules included in the battery. In addition, the battery controller may prevent overcharging and over-discharging of the battery, perform cell balancing, and control the charge mode among the plurality of battery modules included in the battery to be uniform. Thus, the energy efficiency of the battery is increased and the life of the battery may be prolonged.

The battery controller may predict the State of Health (SOH) and the State of Charge (SOC) of the battery. The SOH may indicate how much the performance of the battery is deteriorated compared to when being manufactured, and the SOC may indicate information on the amount of the charge stored in the battery. The battery controller may provide SOH, SOC, and function information to an electronic control unit (ECU).

When performing partial charging and discharging of the battery, the battery controller may predict the SOH of the battery by detecting the constant current charging time (CCCT) based on the predetermined reference information. The predetermined reference information may include reference time information indicating information on a time at which the voltage level of the battery in which full charge/discharge is performed is changed according to a plurality of predetermined voltage intervals through the constant current charging and reference SOH indicating the SOH of the battery in which full charge/discharge is performed. Here, the full charge/discharge may mean that charge/discharge is performed so that the voltage level of the battery reaches the full charge level and the full discharge level, and the partial charge/discharge may mean that the voltage level of the battery charged/discharged between the full charge level and the full discharge level. The predetermined reference information may be generated in advance and stored in the battery controller.

However, since a method of predicting the life of a battery using previously stored reference information requires a preliminary test to construct data (e.g., a lookup table) for the battery, time and cost therefor may arise. Therefore, there is a need for a method of predicting the battery capacity in real time using the capacity information of the initial battery and the time per charge/discharge voltage interval without prior data.

The battery controller divides the voltage level of the battery, which is changed by charging or discharging (e.g., the voltage level is increased or decreased), into a predetermined plurality of voltage sections, and may obtain time information on a voltage change in each divided voltage section. For example, the battery controller may divide the voltage level of the battery being changed into N sections. N is a positive integer, and for example, the battery controller may determine N to be 6.

The battery controller according to an embodiment may divide the voltage level of the battery to be partially charged/discharged into a first section equal to or greater than 3.5 volts (V) and less than 3.6 V, a second section equal to or greater than 3.6 V and less than 3.7 V, a third section equal to or greater than 3.7 V and less than 3.8 V, a fourth section equal to or greater than 3.8 V and less than 3.9 V, a fifth section equal to or greater than 3.9 V and less than 4.0 V, and a sixth section equal to or greater than 4.0 V and less than 4.1 V. For example, the battery controller 120 may detect that the voltage level of the battery changes from 3.6 V to 3.7 V, and may measure the time it takes for the voltage level of the battery to change. The measured time information may be compared with the reference time and the comparison result may be used for battery life prediction. The comparison result may be ratio information obtained by dividing the measured time by the reference time.

The battery controller may obtain the time information corresponding to each divided voltage section on a cycle-by-cycle basis. A cycle may mean the number of times a partial or full charge/discharge is performed. For example, the measured time for the second section of the first cycle is 1100 seconds may mean that the full or partial charge section first charged after battery manufacture includes the second section and the time it takes for the voltage to change from 3.6 V to 3.7 V is 1100 seconds.

As the number of times the battery is charged and discharged increases, the charging time may be shortened. For example, if the time at which the voltage level of the battery that performs the first full charge/discharge changes is 50 minutes, the time for which the voltage level of the battery performing the 500th full charge/discharge changes may be 40 minutes. This may be due to a decrease in capacity of the battery as the number of times charge/discharge is performed increases and the battery deteriorates.

FIG. 1 is a block diagram of a device according to an embodiment of the inventive concept.

The device 200 of FIG. 1 according to an embodiment may mean the battery controller explained above, but is not limited to. Therefore, without any specific explanation, the above description regarding the battery controller may also be applied to the device 200 of FIG. 1.

The device 200 may include an acquisition unit 220 and a prediction unit 240. The device 200 may include an application specific integrated circuit (ASIC), an embedded processor, a microprocessor, hardware control logic, a hardware finite state machine (FSM), a digital signal processor (DSP), or a combination thereof. In an embodiment, device 200 may include at least one or more processors. For example, at least one of the acquisition unit 220 and the prediction unit 240 may be implemented by one or more processors.

The device 200 according to an embodiment may receive information on a current battery to predict the life of the battery. For example, the device 200 may receive information related to a battery model name, a battery type, and a battery capacity (Spec.Ah or Initial Ah), a C-rate, and a battery operating temperature range. The device 200 according to an embodiment determines whether the battery is of the nickel-manganese-cobalt (NMC) type, and in the case of the NMC type, an operation for predicting the battery life may be performed but is not limited thereto. The device 200 according to an embodiment may receive information on voltage, current, and temperature of the battery. The device 200 may determine whether the current battery is in a charge mode or a discharge mode based on the received current information, and determine whether the current battery is within the normal operating range based on the temperature information. If the battery is not within the normal operating range, the device 200 may not perform battery life prediction.

The acquisition unit 220 may divide the voltage level of the battery charged/discharged into a predetermined plurality of voltage sections, and obtain time information for each of a plurality of predetermined voltage sections. For example, the acquisition unit 220 may divide the sections into a first section equal to or greater than 3.5 V and less than 3.6 V, a second section equal to or greater than 3.6 V and less than 3.7 V, a third section equal to or greater than 3.7 V and less than 3.8 V, a fourth section equal to or greater than 3.8 V and less than 3.9 V, a fifth section equal to or greater than 3.9 V and less than 4.0 V, and a sixth section equal to or greater than 4.0 V and less than 4.1 V, and may obtain the time it takes for the voltage level of the battery in the charge mode to change by charging, for each voltage section.

Referring to FIG. 2, Table 320 of FIG. 2 shows the measured time for each section from the 50th cycle to the 64th cycle when the battery is in the charge mode.

Table 340 in FIG. 2 shows the measured time for some discharge voltage sections for each cycle from the 50th cycle to the 64th cycle in the battery discharge mode. The information in Table 340 of FIG. 2 may be used to correct the predicted SOH of the battery. The correction will be described later.

For example, the acquisition unit 220 may measure the charge time for the fourth section at 710 seconds in the 50th cycle. In the 50th cycle, the time was measured for all voltage sections, but for the 53rd cycle, time was measured only for some sections (i.e., five of the six sections).

If the time is obtained for all of a plurality of voltage sections according to an embodiment, the life time of the battery may be predicted by comparing the obtained time information with the reference time.

The reference time may use time information obtained for each of a plurality of predetermined voltage sections during an initial predetermined cycle after the battery is manufactured. For example, the reference time information may be the data of the first full charge/discharge cycle occurring within the first 10 cycles after the battery is manufactured. For example, if the initial 5th cycle is a full charge cycle, the time at which the battery is charged from 3.50 V to 3.60 V may be measured and determined as the reference time for the first section. According to another embodiment, the reference time information may be determined by averaging the data for the initial 5 cycles after battery manufacture. This method may be utilized when there is no full charge/discharge cycle during the initial predetermined cycle. Therefore, since the battery capacity is predicted in real time using the capacity information of the initial battery and the time per charge/discharge voltage section without prior data, time and cost for preparing the prior data may be saved.

The prediction unit 240 may calculate the ratio of time information to the reference time for each voltage section and determine a representative value for the calculated ratios. The representative value may include an average value, a maximum value, a minimum value, and an intermediate value, but is not limited thereto. For example, in the 50th cycle, it is possible to determine a first rate obtained by dividing the measured time of 840 seconds for the first section by the first reference time for the first section, a second rate obtained by dividing the measured time of 1120 seconds for the second section by the second reference time for the second section, a third rate obtained by dividing the measured time of 960 seconds for the third section by the third reference time for the third section, a fourth rate obtained by dividing the measured time of 710 seconds for the fourth section by the fourth reference time for the fourth section, a fifth rate obtained by dividing the measured time of 830 seconds for the fifth section by the fifth reference time for the fifth section, and a sixth rate obtained by dividing the measured time of 590 seconds for the sixth section by the sixth reference time for the sixth section. The prediction unit 240 may determine an average value of the obtained first rate, second rate, third rate, fourth rate, fifth rate and sixth rate as representative values of the 50th cycle, and may predict the determined representative value as the SOH of the battery in the 50th cycle.

The prediction unit 240 according to an embodiment may sum two consecutive voltage sections of a plurality of voltage sections as one voltage section, and based on the ratio of the time measured for the summed voltage section to the reference time corresponding to the summed voltage section, may predict the SOH of the battery.

The prediction unit 240 according to an embodiment may sum the first and second sections as one 1-2 section, and the summed 1-2 section may be a section of 3.50 V or more and less than 3.70 V. The prediction unit 240 according to an embodiment may sum the second and third sections as one 2-3 section, and the summed 2-3 section may be a section of 3.60 V or more and less than 3.80 V. In this way, the prediction unit 240 may determine the 1-2 section summing the first and second sections, the 2-3 section summing the second and third sections, the 3-4 section summing the third and fourth sections, the 4-5 section summing the fourth and fifth sections, and the 5-6 section summing the fifth and sixth sections, and may determine the time for each of the five summed sections.

Referring to FIG. 3, Table 400 is a table shown by determining the time taken to change the voltage for a voltage section in which consecutive voltage sections are summed according to an embodiment. The prediction unit 240 according to an embodiment may determine the time for the summed section of the first and second sections to be 1960 seconds (a sum of 840 seconds for the first section and 1120 seconds for the second section in the 50th cycle of FIG. 2) for the 50th cycle. The prediction unit 240 may determine the ratio by dividing the 1960 seconds determined for the 1-2 section by the reference time for the 1-2 section. For example, the prediction unit 240 may determine the ratio to be 98.5 by dividing 1960 seconds determined for the 1-2 section by 1989 seconds, that is, the reference time for the 1-2 section. In this manner, the prediction unit 240 may determine the ratio for each summed section.

The prediction unit 240 according to an embodiment may determine a representative value for the ratios determined for each summed section. For example, the prediction unit 240 may determine 98.8, which is an average value for the ratios (98.5, 97.7, 99.4, 99.4, 99.3) for each summed section for the 50th cycle and predict the determined average value as the SOH (e.g., 98.8 percent) of the battery in the 50th cycle.

However, it is apparent that the above-described embodiment is only one example for predicting the life of the battery, and those skilled in the art will appreciate that the voltage section may be divided and summed into any number of arbitrary sections to perform battery life prediction using other types of algorithms or methods based on the time information measured per section.

If time information is obtained for only some voltage sections among a plurality of voltage sections according to an embodiment, by correcting the predicted SOH of the battery based on the time of some voltage section, the corrected value may finally be determined as the SOH of the battery. For example, if time information for some sections of the first through sixth sections is not obtained, the prediction unit 240 may perform the correction on the battery SOH predicted based on the obtained time information and the reference time.

Even if there is measured time information for that section, when the section where the battery is charged does not completely includes the corresponding section, a section in which time information according to an embodiment is not obtained may occur. That is, even if the measured time information for the corresponding section does not exist at all, or the measured time information for the corresponding section exists, in a case where it is determined that it is the time measured only for a part of the corresponding section or the time information which is erroneously measured by measurement error, the section may be treated as having no time information.

For example, if the battery is charged from 3.60 V to 3.90 V in the Nth cycle, time information for the first section, the fifth section, and the sixth section may not be obtained. In addition, if the battery is charged from 3.55 V to 3.95 V in the Mth cycle, it may be determined that time information for the first section, the fifth section, and the sixth section is not obtained. That is, when it is charged including the complete corresponding section, it is determined that the time information on the corresponding section is obtained and when it is charged including only a portion of the corresponding section, it may be determined that the time information on the corresponding section is not obtained.

For example, referring again to FIG. 2, in the case of the 52nd cycle, the time information for the first section is obtained in 670 seconds, but the obtained time information may be the time it takes to charge including only a portion of the first section (e.g., 3.55 V to 3.60 V). In this case, the time information for the first section in the 52th cycle may be regarded as not obtained, and the 52nd cycle may not be determined as a cycle in which time information is obtained for all voltage sections. Therefore, for the summed 1-2 section of FIG. 3, it may be determined that the summed time information of 1690 seconds is inadequate to be used as information for predicting the SOH of the battery.

According to an embodiment, for the current cycle, if the ratio information determined for any section of the plurality of voltage sections is different from the ratio information determined for the section in the previous cycle by more than the threshold value, the prediction unit 240 determines that the ratio information for the section determined in the current cycle is inappropriate to be used as information for predicting the SOH of the battery, so that it may replace it with another value or may not use it (e.g., filtering).

For example, if the ratio calculated for the Xth section of the current Nth cycle in the current cycle is different from the ratio calculated for the Xth section of the Nth cycle by more than 5 percent, the prediction unit 240 may ignore rate information (measured time/reference time) for the current cycle through filtering. For example, referring to FIG. 3, if the time (1690 seconds) for the 1-2 section of the 52nd cycle (i.e., 3.50 V to 3.70 V) differs from the time for the 1-2 section of the 51st cycle (1970 seconds) by more than a threshold ratio or a threshold value, since the time measured for the 1-2 section of the 52nd cycle is difficult to see as the time measured during charging including the 1-2 section completely, the time for the 1-2 section of the 52nd cycle may not be used to calculate the ratio.

According to an embodiment, in the 52th cycle, no ratio information was obtained for the 1-2 section and the 2-3 section. For example, the prediction unit 240 determines that the time information for the 1-2 section and the 2-3 section in the 52nd cycle is inadequate time information due to insufficient time acquisition or measurement error, so that it may not calculate rate information based on time information from the beginning or ignore the calculated rate information (indicated as 'FALSE' in FIG. 3).

As described above, in a case where the prediction unit 240 according to an embodiment performs the lifetime prediction of the battery using only the time information for some sections of the first to sixth sections, it is possible to correct the predicted SOH of the battery based on the time information on the obtained some sections. For example, if time information is obtained for only four of the six sections, the obtained time information for each of the four sections may be divided by each reference time to obtain a ratio, and a representative value for the obtained ratio values may be determined.

However, the prediction unit 240 may perform correction on the representative value, rather than determining the determined representative value as the predicted life of the battery. If only some of the charging voltage sections are utilized, in consideration that it may be predicted differently from the actual battery life because a difference between the change slope of voltage over time in the utilized some sections and the slope change of voltage over time in the entire section becomes larger, correction may be performed. For example, the voltage change slope over time in some sections of the battery in charge mode may be greater than the voltage change slope in the entire section, and accordingly, the prediction unit 240 considers that the predicted lifetime may be predicted to be smaller than the actual life of the battery to perform correction on the expected lifetime.

The correction according to an embodiment may be performed using time information on the discharge voltage section. The time information for the discharge voltage section may include time information for the voltage level of the battery to change (for example, decrease in voltage) when the battery is in the discharge mode.

The time taken for the voltage level of the battery in the discharge mode to change may be obtained for each predetermined discharge voltage section. The predetermined discharge voltage section may be determined as a section in which the voltage decrease slope according to time of the corresponding section is smaller than the voltage decrease slope in the entire section including the corresponding section. For example, the entire section may include a voltage section from full charge voltage to 2 V, and the voltage decrease slope in the entire section may be determined by averaging the voltage slope of each section, but is not limited thereto. For example, the overall section may vary depending on the battery type.

The predetermined discharge voltage section according to an embodiment may include at least one section of a voltage section of 3.80 V or less and 3.70 V or more, and a voltage section of 3.70 V or less and 3.60 V or more. The predetermined discharge voltage section according to an embodiment may be determined at intervals of 0.1 V. For example, the prediction unit 240 may determine a value obtained by dividing the time the voltage drops from 3.80 V to 3.70 V when a battery is in a discharge mode by a reference time (e.g., the time obtained from the initial discharge cycle) as a C value for correction. Or, the prediction unit 240 may determine a C value for correction as a value obtained by dividing the time the voltage drops from 3.70 V to 3.60 V when a battery is in a discharge mode by a reference time.

Hereinafter, referring to FIG. 4, since the 50th cycle is a cycle in which time information on all sections is obtained, it is not necessary to correct for the determined SOH 98.8 of the battery. However, the 52th cycle may require correction because it is determined that the time information is obtained only in some sections. (As described above with reference to FIG. 2, since it is difficult to regard the time information obtained for the first section of the 52nd cycle as the time it takes to charge including the entire first section, it may be considered as inappropriate information to predict battery life, and the time information for the first section may be regarded as not obtained.)

In the 52nd cycle, the battery SOH may be determined by summing the six sections by two consecutive sections. However, as described above with reference to FIG. 3, the ratio information is not calculated for the 1-2 section and the 2-3 section in the 52nd cycle, or the calculated ratio information is determined to be inappropriate for use as data for life prediction, so that filtering is performed. Therefore, based on the three ratios (98.8, 98.7, and 99.3) for the section 3-4, the section 4-5, and the section 5-6, 98.9, that is, the average value 520, may be calculated. However, the correction may be performed on the calculated average value 520 and the value on which the correction is performed may be determined as the battery SOH.

The prediction unit 240 according to an embodiment calculates the average value (98.9) of the three ratios (98.8, 98.7, 99.3), and averages the calculated average value and 100.0 (342 of FIG. 2), that is, the C value for correction, to determine 99.5 as battery SOH.

The prediction unit 240 according to an embodiment may selectively apply a filter to the determined battery SOH (including both the battery SOH obtained without correction as data for all sections is obtained and the battery SOH obtained as data for some sections is obtained and correction is performed). The filter according to an embodiment can be designed not to use the battery SOH in the present Nth cycle as it is when the battery SOH determined in the current Nth cycle is compared with the battery SOH determined in the immediately preceding cycle (for example, the (N−1)-th cycle) in which data is obtained and then, the battery SOH in the current cycle differs from the battery SOH in the immediately preceding cycle in which the data is obtained by a predetermined threshold value or a threshold ratio or more. For example, the prediction unit 240 may not use the battery SOH in the current Nth cycle, or may replace it with another value. For example, the battery SOH determined in the current Nth cycle may be replaced with the battery SOH in the immediately preceding cycle in which data is obtained.

The prediction unit 240 according to an embodiment may correct the battery SOH predicted in the cycle after the cycle of full discharge based on the SOH of the battery obtained in the cycle in which the battery is fully discharged. For example, the prediction unit 240 may perform an additional correction using an offset value. As values used to more accurately predict, the offset value may be determined based on the actual battery SOH obtained in the cycle in which the battery is fully discharged, and may be used to correct the predicted battery SOH determined in subsequent cycles.

Figure 4:
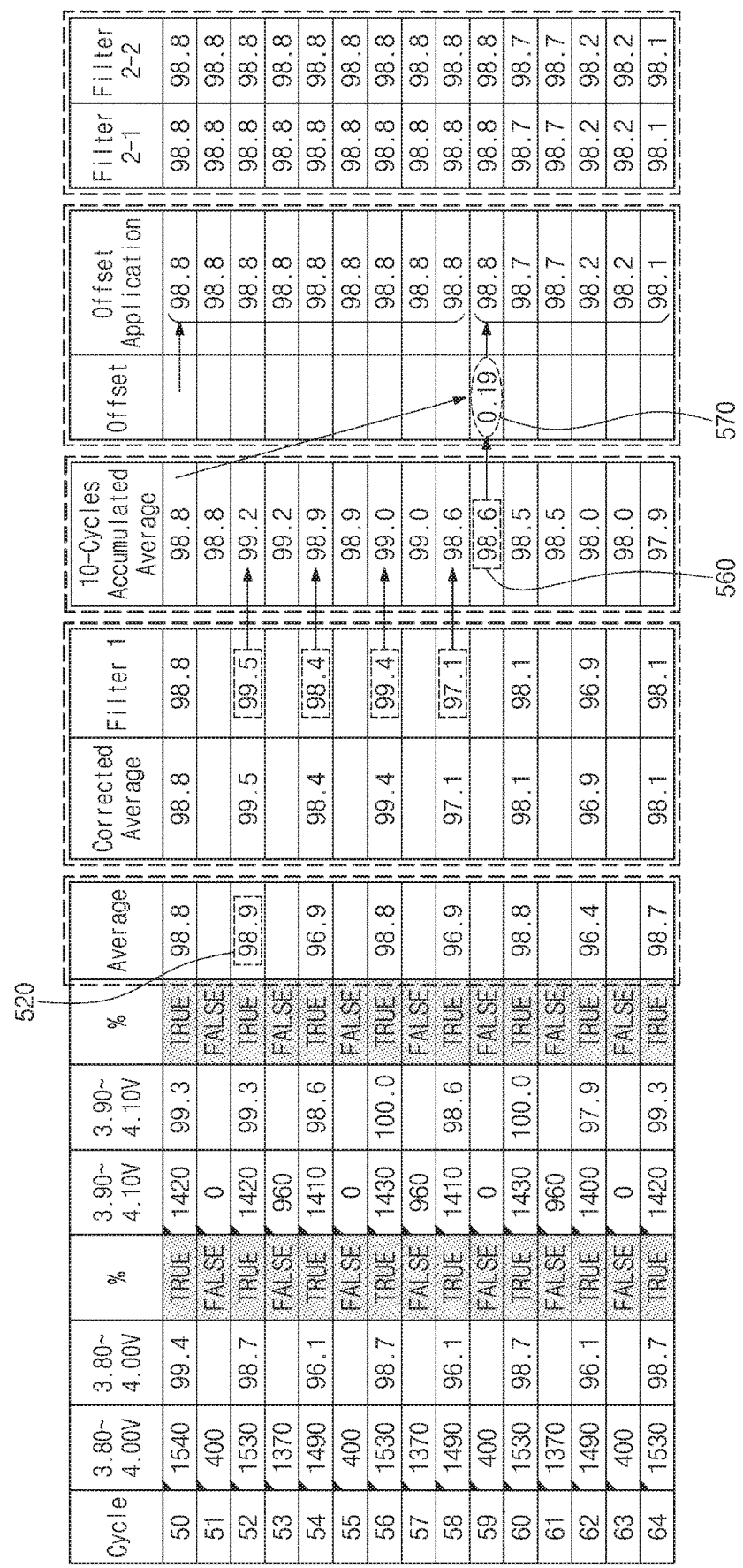
FIG. 4 is a table showing a process of performing a correction on a life expectancy of a battery and applying an offset and a filter according to an embodiment.

For example, referring to FIG. 4, if the 50th cycle is a full discharge cycle, the prediction unit 240 may determine 98.8 as the actual battery SOH. The prediction unit 240 according to an embodiment may calculate a cumulative average 560 of battery SOHs of a predetermined number of cycles existing after the 50th cycle, and determine 0.19, which is a difference value between 98.8, that is, the actual battery SOH, and 98.6, that is, the cumulative average 560. The determined offset value 570 may be used to further correct the battery SOH determined in subsequent cycles. For example, if the battery SOH determined in the 60th cycle is 98.5, the prediction unit 240 may determine the battery SOH to be 98.7 percent by adding 0.19, which is an offset value, to the determined battery SOH.

The prediction unit 240 according to the embodiment may further apply filters (Filters 2-1 and 2-2) to the battery SOH to which the offset value is applied. For example, if the battery SOH of the immediately preceding cycle is different by more than a threshold ratio or a threshold value, or the battery SOH determined in the current cycle is determined to be an inappropriate value by referring to the previously determined actual battery SOH value, the battery SOH of the current cycle may not be used or may be replaced with another value. But, it is apparent that such a filter may not be employed according to the selection of those skilled in the art, and that other filters based on other algorithms or conditions may be employed.

Figure 5:
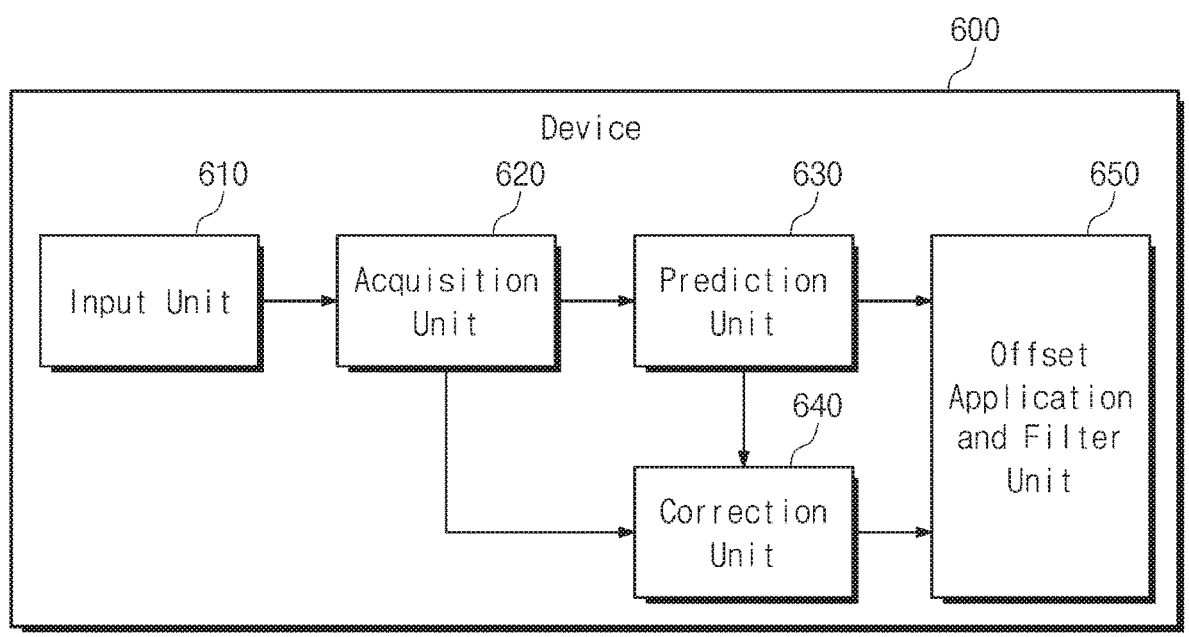
FIG. 5 is a block diagram illustrating a device according to an embodiment.

FIG. 5 is a block diagram of a device according to an embodiment.

A device 600 represents a specific embodiment of the device 200 of FIG. 1. Therefore, the contents described for the device 200 of FIG. 1 may be applied to the device 600.

The device 600 may include an input unit 610, an acquisition unit 620, a prediction unit 630, a correction unit 640, and an offset application and filter unit 650.

The input unit 610 may receive information related to a battery model name, a type, and a capacity (Spec.Ah or Initial Ah), a C-rate, and a battery operating temperature range. The device 600 according to an embodiment determines whether the battery is of the nickel-manganese-cobalt (NMC) type, and in the case of the NMC type, an operation for predicting the battery life may be performed but is not limited thereto. The input unit 610 according to an embodiment may receive information on voltage, current, and temperature of the battery. It is possible to determine whether the current state of the battery is the charge mode or the discharge mode based on the sign of the current inputted from the input unit 610. Also, it may be determined whether the current battery is within the normal operating range based on the temperature information inputted from the input unit 610, and if the battery is not within its normal operating range, the device 600 may not perform battery life prediction.

The acquisition unit 620 may divide the voltage level of the battery charged/discharged into a predetermined plurality of voltage sections, and obtain time information for each of a plurality of predetermined voltage sections. According to an embodiment, the acquisition unit 620 may divide a voltage level of a battery to be charged/discharged into a first section equal to or greater than 3.5 V and less than 3.6 V, a second section equal to or greater than 3.6 V and less than 3.7 V, a third section equal to or greater than 3.7 V and less than 3.8 V, a fourth section equal to or greater than 3.8 V and less than 3.9 V, a fifth section equal to or greater than 3.9 V and less than 4.0 V, and a sixth section equal to or greater than 4.0 V and less than 4.1 V, and may obtain the time it takes for the voltage level of the battery in the charge mode to change through charging, for each voltage section.

The acquisition unit 620 according to an embodiment may obtain time information on the discharge voltage section. The time information for the discharge voltage section may include time information for the voltage level of the battery to change (for example, decrease) when the battery is in the discharge mode. The time taken for the voltage level of the battery in the discharge mode to change may be obtained for each predetermined discharge voltage section. The predetermined discharge voltage section may be determined as a voltage section in which the voltage decrease slope with time of the battery according to the discharge is smaller than the voltage decrease slope with time in the entire section including the corresponding discharge voltage section. For example, the voltage decrease slope in the entire section may be obtained by averaging the voltage decrease slopes determined for a plurality of voltage sections, but is not limited thereto. The time information on the discharge voltage section may be used to correct the battery SOH predicted in the correction unit 640. According to an embodiment, if time information on some sections of the plurality of voltage sections is not obtained, a correction for the battery SOH predicted based on the time information on the discharge voltage section may be performed.

The prediction unit 630 may predict the SOH of the battery based on ratio information determined by comparing a time obtained for each of a plurality of predetermined voltage sections with a reference time for each of a predetermined plurality of voltage sections. If the time is obtained for all of a predetermined plurality of voltage sections according to an embodiment, the life time of the battery may be predicted by comparing the obtained time information with the reference time information. For example, if time information is obtained for all voltage sections for the divided five sections, the prediction unit 630 may obtain the ratio information by dividing the time for each section by the reference time for each section and then determine the predicted SOH of the battery by averaging the ratio information for each section.

If time information is obtained for only some voltage sections among a predetermined plurality of voltage sections according to an embodiment, the device 600 may correct the predicted SOH of the battery based on the time of some voltage section to determine the corrected value as the battery SOH. For example, if no time information is obtained for two of the six divided sections, the prediction unit 630 predicts the SOH of the battery based on the time information obtained for the four sections, and transmits the predicted SOH of the battery to the correction unit 640.

The correction unit 640 may correct the SOH of the battery received from the prediction unit 630 based on the time information on the discharge voltage section received from the acquisition unit 620. The correction unit 640 according to an embodiment may determine the C value for correction based on the time information on the discharge voltage section transmitted from the acquisition unit 620. The C value for correction may be determined as the ratio value obtained by dividing the time the voltage drops from 3.80 V to 3.70 by a reference time when the battery is in the discharge mode. For example, the correction unit 640 may correct the battery SOH by averaging the predicted SOH of the battery and the C value received from the prediction unit 630.

The offset application and filter unit 650 according to an embodiment may perform an additional correction using the offset value in the predicted SOH of the battery. As values used to more accurately predict, the offset value may be determined based on the actual battery SOH obtained in the cycle in which the battery is fully discharged, and may be used to correct the predicted battery SOH determined in subsequent cycles. In addition, the offset application and filter unit 650 according to an embodiment may further apply a filter to the battery SOH to which the offset value is applied. For example, if the battery SOH of the immediately preceding cycle is different by more than a threshold ratio or a threshold value, or the battery SOH determined in the current cycle is determined to be an inappropriate value by referring to the previously determined actual battery SOH value, a filter may be designed so that the battery SOH of the current cycle may not be used or may be replaced with another value.

Figure 6:
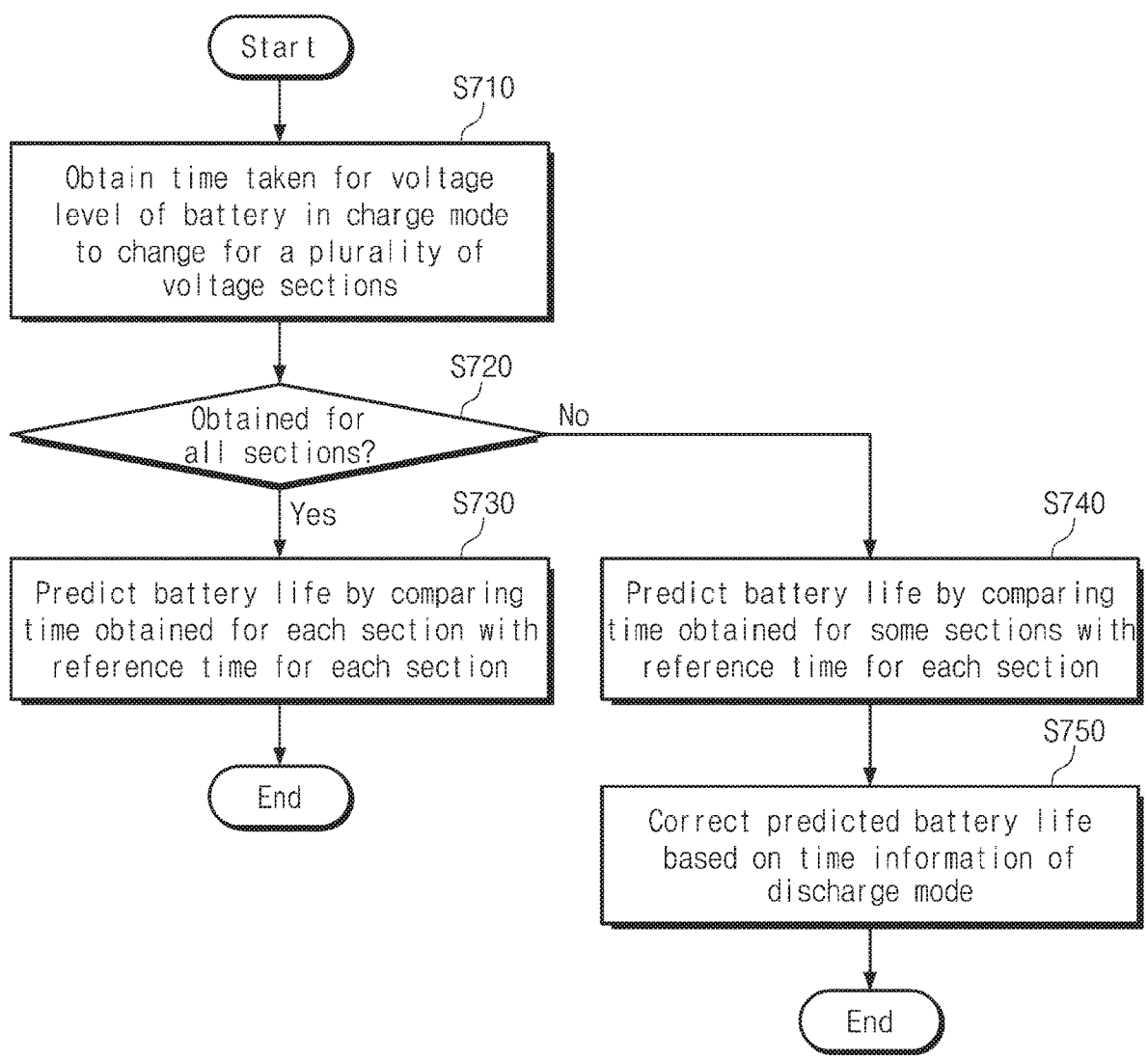
FIG. 6 illustrates a flowchart of a method for predicting battery life in a device according to an embodiment.

FIG. 6 illustrates a flowchart of a method for predicting battery life in a device according to an embodiment.

In operation S710, the device 200 may obtain the time taken for the voltage level of the battery of the charge mode to change in each of a predetermined plurality of voltage sections. For example, the device 200 may divide a voltage level of a battery where charge/discharge is performed into a first section equal to or greater than 3.5 V and less than 3.6 V, a second section equal to or greater than 3.6 V and less than 3.7 V, a third section equal to or greater than 3.7 V and less than 3.8 V, a fourth section equal to or greater than 3.8 V and less than 3.9 V, a fifth section equal to or greater than 3.9 V and less than 4.0 V, and a sixth section equal to or greater than 4.0 V and less than 4.1 V, and may obtain the time it takes for the voltage level of the battery to change through charging, for each section. According to an embodiment, the device 200 sums two consecutive voltage sections of a plurality of voltage sections into one voltage section, and uses the time for the summed voltage section as data for predicting the battery SOH.

In operation S720, the device 200 may determine whether time information has been obtained for all of a plurality of predetermined voltage sections. When the time information for all sections is obtained, it proceeds to operation S730, and when time information is obtained only for some voltage sections among a plurality of voltage sections, it proceeds to operation S740.

In operation S730, the device 200 compares the time obtained for each of a plurality of voltage sections with a reference time for each of a plurality of voltage sections to determine ratio information, it may predict the life of the battery based on the determined ratio information. For example, the device 200 may determine rate information for a reference time for each of a plurality of voltage sections and predict an average value of the determined rate information based on the battery life.

In operation S740, the device 200 compares the time obtained for each partial voltage section with a reference time for each partial voltage section to determine ratio information, it may predict the life of the battery based on the determined ratio information. For example, the device 200 may compare the time obtained for the four voltage sections of the six voltage sections determined in operation S710 with the reference time to determine ratio information and predict the life of the battery based on the determined ratio information. For example, the device 200 may predict the average value of the determined ratio information as the lifetime of the battery. The SOH of the battery predicted based on a partial voltage section may be corrected in operation S750.

In step S750, the device 200 may correct the predicted SOH of the battery based on the time it takes for the voltage level of the battery in the discharge mode to change. The time taken for the voltage level of the battery in the discharge mode to change may be obtained for each predetermined discharge voltage section. The predetermined discharge voltage section may be determined as a voltage section in which the voltage decrease slope with time according to discharge is smaller than the voltage decrease slope with time in the entire section including the corresponding section. For example, the voltage decrease slope with time in the entire section may be obtained by averaging the voltage decrease slopes determined for each of a plurality of voltage sections, but is not limited thereto. For example, when the battery is in the discharge mode, the ratio value (e.g., 100%) obtained by dividing the time at which the voltage drops from 3.80 V to 3.70 V by the reference time is determined as a C value for correction, and the predicted battery SOH received from operation S740 may be averaged with the C value to determine the SOH of the battery.

The above-described method may be implemented as a computer-readable code on a computer-readable recording medium. The computer-readable recording medium includes all kinds of storage devices in which data readable by a computer system is stored. Examples of the computer readable recording medium may include ROM, RAM, CD-ROM, magnetic tape, floppy disk, and an optical data storage device and may also be implemented in the form of transmission over the Internet. In addition, the computer-readable recording medium may be distributed over a networked computer system so that code readable by the processor in a distributed fashion may be stored and executed.

Although the exemplary embodiments of the inventive concept have been described, it is understood that the inventive concept should not be limited to these exemplary embodiments but various changes and modifications can be made by one ordinary skilled in the art within the spirit and scope of the inventive concept as hereinafter claimed.

What is claimed is:

1. A device comprising a processor configured to process life information of a battery, the processor comprising:

an acquisition circuit configured to obtain a time taken for a voltage level of the battery in a charge mode to change for each of a plurality of voltage sections; and a prediction circuit configured to predict a state of health (SOH) of the battery based on ratio information determined by comparing the time obtained for each of the plurality of voltage sections with a reference time for each of the plurality of voltage sections, wherein when the time taken for some voltage sections of the plurality of voltage sections is obtained by the acquisition circuit, the prediction circuit is further configured to correct the predicted SOH of the battery based on the time taken for the voltage level of the battery in a discharge mode to change.

2. The device of claim 1, wherein the reference time for each of the plurality of voltage sections is a time taken for the voltage level of the battery in the charge mode to change during an initial cycle for each of the plurality of voltage sections.

3. The device of claim 1, wherein a time taken for the voltage level of the battery in the discharge mode to change is obtained for each of a plurality of discharge voltage sections, and each of the discharge voltage sections is determined as a voltage section in which a voltage decrease slope is smaller than a voltage decrease slope in an entire section.

4. The device of claim 3, wherein the discharge voltage sections comprises at least one section of a voltage section below 3.80 V and above 3.70 V, and a voltage section below 3.70 V and above 3.60 V.

5. The device of claim 1, wherein the prediction circuit is further configured to obtain a plurality of ratio values by dividing the time obtained for each of the plurality of voltage sections by the reference time for each of the plurality of voltage sections and predicts the SOH of the battery based on an average value of the obtained plurality of ratio values.

6. The device of claim 1, wherein the prediction circuit is further configured to sum two consecutive voltage sections of the plurality of voltage sections into one voltage section, and compares a time taken for the voltage level to change in the summed voltage section with a reference time corresponding to the summed voltage section to predict the SOH of the battery.

7. The device of claim 1, wherein the prediction circuit is further configured to corrects the SOH of the battery predicted after a cycle in which the battery is completely discharged, based on the SOH of the battery obtained in the cycle in which the battery is fully discharged.

8. A method comprising:
obtaining a time taken for a voltage level of a battery in a charge mode to change for each of a plurality of voltage sections;
predicting a state of health (SOH) of the battery based on ratio information determined by comparing the time obtained for each of the plurality of voltage sections with a reference time for each of the plurality of voltage sections; and
when the time taken for some voltage sections of the plurality of voltage sections is obtained, correcting the predicted SOH of the battery based on a time taken for the voltage level of the battery in a discharge mode to change.

9. The method of claim 8, wherein the reference time for each of the plurality of voltage sections is a time taken for the voltage level of the battery in the charge mode to change during an initial cycle for each of the plurality of voltage sections.

10. The method of claim 8, wherein a time taken for the voltage level of the battery in the discharge mode to change is obtained for each of discharge voltage sections, and each of the discharge voltage sections is determined as a voltage section in which a voltage decrease slope is smaller than a voltage decrease slope in an entire section.

11. The method of claim 10, wherein the discharge voltage sections comprises at least one section of a voltage section below 3.80 V and above 3.70 V, and a voltage section below 3.70 V and above 3.60 V.

12. The method of claim 8, wherein the predicting of the SOH of the battery comprises obtaining a plurality of ratio values by dividing the time obtained for each of the plurality of voltage sections by the reference time for each of the plurality of voltage sections and predicting the SOH of the battery based on an average value of the obtained plurality of ratio values.

13. The method of claim 8, wherein the predicting of the SOH of the battery comprises summing two consecutive voltage sections of the plurality of voltage sections into one voltage section, and comparing a time taken for the voltage level to change in the summed voltage section with a reference time corresponding to the summed voltage section to predict the SOH of the battery.

14. The method of claim 8, wherein the correcting of the predicted SOH of the battery comprises correcting the SOH of the battery predicted after a cycle in which the battery is completely discharged, based on the SOH of the battery obtained in the cycle in which the battery is fully discharged.

* * * * *